(12) United States Patent
Kwong

(10) Patent No.: US 6,459,593 B1
(45) Date of Patent: Oct. 1, 2002

(54) ELECTRONIC CIRCUIT BOARD

(75) Inventor: Herman Kwong, Kanata (CA)

(73) Assignee: Nortel Networks Limited, Quebec (CA)

( * ) Notice: Subject to any disclaimer, the term of this patent is extended or adjusted under 35 U.S.C. 154(b) by 0 days.

(21) Appl. No.: 09/739,977

(22) Filed: Dec. 20, 2000

Related U.S. Application Data

(63) Continuation-in-part of application No. 09/636,594, filed on Aug. 10, 2000.

(51) Int. Cl.$^7$ .............................. H05K 1/00; H05K 1/16
(52) U.S. Cl. ...................... 361/761; 361/762; 361/764; 361/795; 174/255; 174/260
(58) Field of Search ................................ 361/761–762, 361/764, 767, 768, 795; 174/255, 260, 265

(56) References Cited

U.S. PATENT DOCUMENTS

| | | | | |
|---|---|---|---|---|
| 5,315,486 A | * | 5/1994 | Fillion et al. .............. | 361/795 |
| 5,371,321 A | * | 12/1994 | Hamzehdoost et al. .... | 174/52.4 |
| 5,386,343 A | * | 1/1995 | Pao .............................. | 361/761 |
| 5,780,776 A | * | 7/1998 | Noda .......................... | 174/255 |
| 6,324,067 B1 | * | 11/2001 | Nishiyama .................. | 361/761 |

* cited by examiner

*Primary Examiner*—David Martin
*Assistant Examiner*—Dameon E. Levi
(74) *Attorney, Agent, or Firm*—Hunton & Williams

(57) ABSTRACT

A technique for increasing electronic component density on circuit boards is disclosed. In one embodiment, the technique is realized as an improved electronic circuit board for enabling the stacking of electronic components. The electronic circuit board has an electrically conductive signal layer formed on a dielectric layer, wherein the electrically conductive signal layer has a plurality of electrically conductive pads formed therein. The improvement comprises a cavity in the electronic circuit board extending through the electrically conductive signal layer and the dielectric layer. The cavity is sized to accommodate a first electronic component therein such that at least one first electrical connection may be formed between the first electronic component and a first portion of the plurality of electrically conductive pads, and at least one second electrical connection may be formed between a second electronic component, which is stacked over the first electronic component, and a second portion of the plurality of electrically conductive pads.

14 Claims, 2 Drawing Sheets

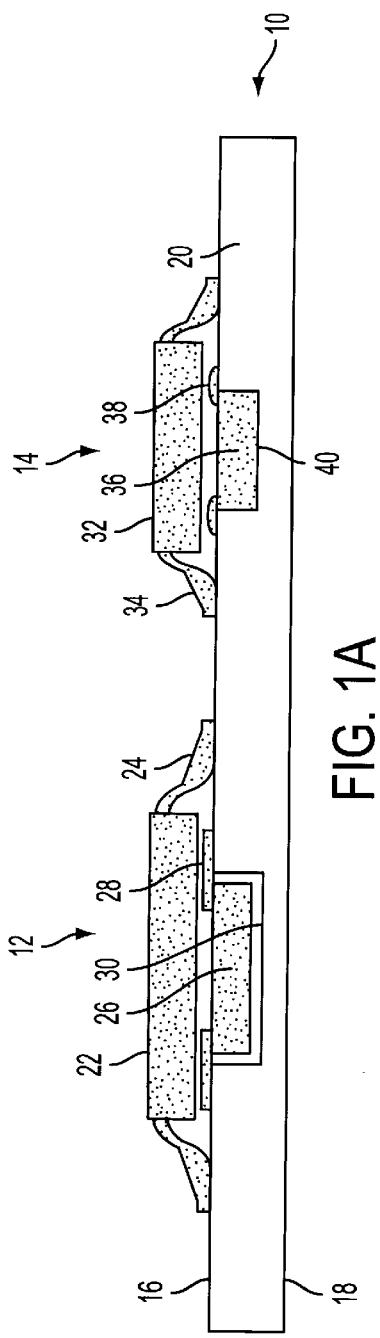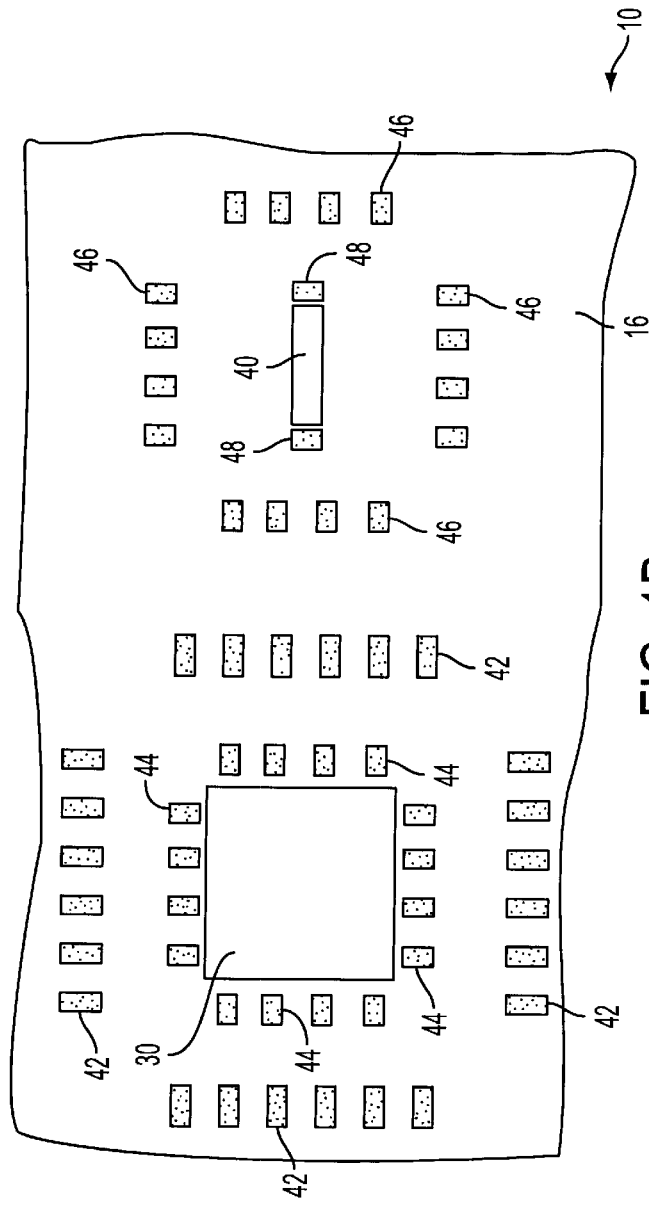

ELECTRONIC CIRCUIT BOARD

CROSS-REFERENCE TO RELATED APPLICATIONS

This patent application is a continuation-in-part application of U.S. patent application Ser. No. 09/636,594, filed Aug. 10, 2000, which is hereby incorporated by reference herein in its entirety.

FIELD OF THE INVENTION

The present invention relates generally to electronic circuit boards and, more particularly, to an improved electronic circuit board for enabling the stacking of electronic components.

BACKGROUND OF THE INVENTION

Computer systems are increasingly used to perform more and more functions. As a result of this increase in functionality, the number of electronic components that are used within these computer systems correspondingly increases. Typically, such electronic components are mounted on a circuit board, which is then placed into a computer cabinet or chassis so as to allow the circuit board, and the electronic components mounted thereon, to interface with other circuit boards and electronic components. However, there is only a limited amount of space within a computer cabinet or chassis for accommodating circuit boards, and hence the electronic components mounted thereon. Thus, a need has arisen for developing schemes for increasing the density of electronic components on circuit boards.

Perhaps the first scheme that was developed for increasing the density of electronic components on circuit boards was the use of multilayer circuit boards. Such multilayer circuit boards allow more electrical signals to be routed between electronic components than what was previously possible using only single layer circuit boards. It follows that the density of electronic components is typically greater on a multilayer circuit board than on a single layer circuit board due to the increased number of electrical signals that may be routed between electronic components mounted on a multilayer circuit board.

While the use of multilayer circuit boards has allowed an increase in electronic component density, this increase in electronic component density has heretofore been limited by the amount of board surface area. That is, there is only a limited amount of surface area upon which electronic components may be mounted on a circuit board. With computer system functionality requirements, and hence electronic component requirements, only continuing to increase, there is a need to further increase electronic component density on multilayer circuit boards.

In view of the foregoing, it would be desirable to provide a technique for increasing electronic component density on circuit boards.

SUMMARY OF THE INVENTION

According to the present invention, a technique for increasing electronic component density on circuit boards is provided. In one embodiment, the technique is realized as an improved electronic circuit board for enabling the stacking of electronic components. The electronic circuit board has an electrically conductive signal layer formed on a dielectric layer, wherein the electrically conductive signal layer has a plurality of electrically conductive pads formed therein. The improvement comprises a cavity in the electronic circuit board extending through the electrically conductive signal layer and the dielectric layer. The cavity is sized to accommodate a first electronic component therein such that at least one first electrical connection may be formed between the first electronic component and a first portion of the plurality of electrically conductive pads, and at least one second electrical connection may be formed between a second electronic component, which is stacked over the first electronic component, and a second portion of the plurality of electrically conductive pads.

The first and second electronic components are typically either an integrated circuit component or a discrete component, and the type of electrical connections formed are dependent upon the type of component. For example, a solder bridge may form the first electrical connection between an electrically conductive contact pad and leadless contacts of the first electronic component.

In accordance with further aspects of the present invention, at least the lateral dimensions of the cavity are beneficially sized to directly coincide with at least the lateral dimensions of the first electronic component. This alleviates the need for any specialized positioning equipment, which has heretofore typically been required when mounting electronic components on circuit boards.

In accordance with further aspects of the present invention, the cavity is beneficially formed as a channel through which air may be forced for cooling at least the first electronic component.

In accordance with still further aspects of the present invention, wherein the cavity is a first cavity, wherein the dielectric layer is a first dielectric layer, wherein the electrically conductive signal layer is a first electrically conductive layer, wherein the electronic circuit board has a second electrically conductive layer disposed above the first electrically conductive layer within the electronic circuit board, and wherein the second electrically conductive layer is separated from the first electrically conductive signal layer by at least one second dielectric layer, the improvement further beneficially comprises a second cavity in the electronic circuit board extending through the second electrically conductive layer and the at least one second dielectric layer so as to expose at least the first and second portions of the plurality of electrically conductive pads within the second cavity. The second cavity is beneficially sized to accommodate the second electronic component therein. Also, the second cavity is beneficially sized so as to be larger in lateral dimension than the first cavity. Further, the second electrically conductive layer is typically an electrically conductive signal layer or an electrically conductive power/ground plane layer. In such a case, a third electronic component, that is stacked over the second electronic component, can make electrical contact with the second electrically conductive layer. The third electronic component can be an electrically conductive shield for shielding electromagnetic interference to and from the first and second electronic components. In this case, the second electronic component is typically either an integrated circuit component or a discrete component.

In accordance with still further aspects of the present invention, wherein the electronic circuit board is a double-sided electronic circuit board, wherein the cavity is a first cavity on a first side of the electronic circuit board, wherein the dielectric layer is a first dielectric layer, wherein the electrically conductive signal layer is a first electrically conductive layer having a first plurality of electrically conductive pads formed therein, wherein the electronic circuit board has a second electrically conductive signal layer formed on a second dielectric layer, wherein the second electrically conductive signal layer has a second plurality of electrically conductive pads formed therein, and wherein the second dielectric layer is disposed beneath the second electrically conductive signal layer relative to a second side of the electronic circuit board, the improvement further comprises a second cavity on the second side of the electronic circuit board extending through the second electrically conductive signal layer and the second dielectric layer. The second cavity is beneficially sized to accommodate a third electronic component therein such that at least one third electrical connection may be formed between the third electronic component and a first portion of the second plurality of electrically conductive pads, and at least one fourth electrical connection may be formed between a fourth electronic component, which is stacked over the third electronic component, and a second portion of the second plurality of electrically conductive pads. In such a case, the second cavity can be located substantially opposite the first cavity in the electronic circuit board.

In an alternative embodiment, the technique is realized as a method for increasing electronic component density on an electronic circuit board. The electronic circuit board has an electrically conductive signal layer formed on a dielectric layer, wherein the electrically conductive signal layer has a plurality of electrically conductive pads formed therein. The method comprises forming a cavity in the electronic circuit board extending through the electrically conductive signal layer and the dielectric layer. The cavity is beneficially sized to accommodate a first electronic component therein such that at least one first electrical connection may be formed between the first electronic component and a first portion of the plurality of electrically conductive pads, and at least one second electrical connection may be formed between a second electronic component, which is stacked over the first electronic component, and a second portion of the plurality of electrically conductive pads.

In accordance with other aspects of the present invention, the cavity may formed by etching the cavity in the electronic circuit board. For example, the cavity may be etched by photolithographically etching the cavity in the electronic circuit board, or plasma etching the cavity in the electronic circuit board. Alternatively, the cavity may be formed by milling the cavity in the electronic circuit board. For example, the cavity may be formed by laser ablating the cavity in the electronic circuit board. Alternatively still, the cavity may be formed by prefabricating at least one of the electrically conductive signal layer and the dielectric layer such that the cavity is formed upon assembly of the electrically conductive signal layer and the dielectric layer in the electronic circuit board.

In accordance with further aspects of the present invention, wherein the cavity is a first cavity, wherein the dielectric layer is a first dielectric layer, wherein the electrically conductive signal layer is a first electrically conductive layer, wherein the electronic circuit board has a second electrically conductive layer disposed above the first second electrically conductive layer within the electronic circuit board, and wherein the second electrically conductive layer is separated from the first electrically conductive layer by at least one second dielectric layer, the method further beneficially comprises forming a second cavity in the electronic circuit board extending through the second electrically conductive layer and the at least one second dielectric layer so as to expose at least the first and second portions of the plurality of electrically conductive pads within the second cavity. The second cavity is beneficially sized to accommodate the second electronic component therein.

In accordance with still further aspects of the present invention, wherein the electronic circuit board is a double-sided electronic circuit board, wherein the cavity is a first cavity on a first side of the electronic circuit board, wherein the dielectric layer is a first dielectric layer, wherein the electrically conductive signal layer is a first electrically conductive layer having a plurality of electrically conductive pads formed therein, wherein the electronic circuit board has a second electrically conductive signal layer formed on a second dielectric layer, wherein the second electrically conductive signal layer has a second plurality of electrically conductive pads formed therein, and wherein the second dielectric layer is disposed beneath the second electrically conductive signal layer relative to a second side of the electronic circuit board, the method further comprises forming a second cavity on the second side of the electronic circuit board extending through the second electrically conductive signal layer and the second dielectric layer. The second cavity is beneficially sized to accommodate a third electronic component therein such that at least one third electrical connection may be formed between the third electronic component an a first portion of the second plurality of electrically conductive pads, and at least one fourth electrical connection may be formed between a fourth electronic component, which is stacked over the third electronic component, and a second portion of the second plurality of electrically conductive pads.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 1a is a side cross-sectional view of a single-sided electronic circuit board having groups of stacked electronic components in accordance with the present invention.

FIG. 1b is a top view of the single-sided electronic circuit board shown in FIG. 1a with the groups of stacked electronic components removed.

DETAILED DESCRIPTION OF EXEMPLARY EMBODIMENT(S)

Figure 2:
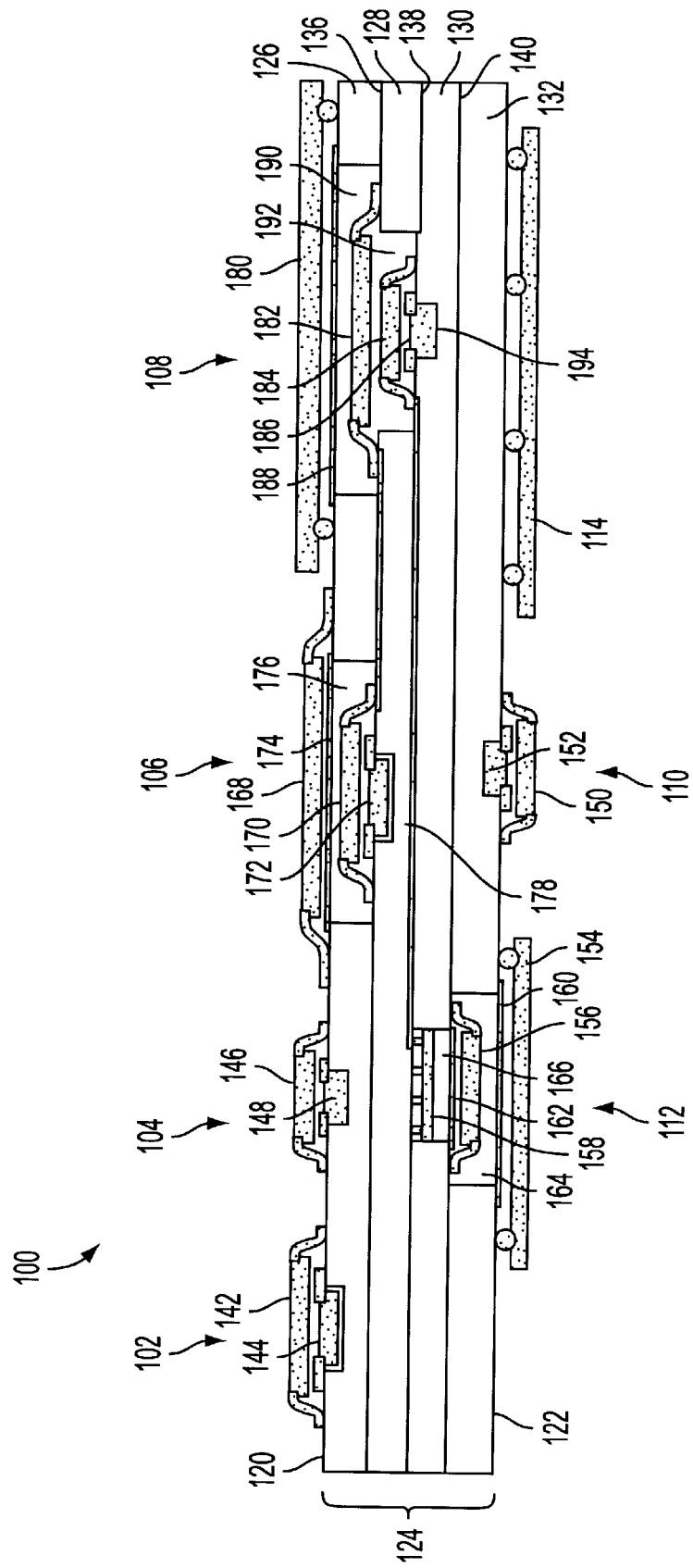
FIG. 2 is a side cross-sectional view of a double-sided multilayer electronic circuit board having groups of stacked electronic components in accordance with the present invention.

Referring to FIG. 1a, there is shown a side cross-sectional view of a single-sided electronic circuit board 10 having groups of stacked electronic components 12 and 14 in accordance with the present invention. As shown, the electronic circuit board 10 comprises a primary (top) layer 16 formed on a single non-electrically conductive dielectric layer 20. The top layer 16 typically comprises electrically conductive signal tracks and power/ground tracks (not shown), in addition to electrically conductive contact pads (see FIG. 1b) to which electronic components may be electrically connected, as described in detail below.

Although not shown, the electronic circuit board 10 typically comprises one or more intermediate layers. These intermediate layers typically alternate between non-electrically conductive dielectric layers and either electrically conductive signal layers or electrically conductive power/ground plane layers. However, for purposes of this description, no intermediate layers are shown and only a single non-electrically conductive dielectric layer 20 is shown, upon which the top layer 16 is formed.

The first group of stacked electronic components 12 comprises a first electronic component 22 having a curved gull wing leaded package (see curved gull wing lead 24) and a second electronic component 26 having a flat gull wing leaded package (see flat gull wing lead 28). The curved gull wing leads 24 of the first electronic component 22 are electrically connected to a first portion 42 of the electrically conductive contact pads formed on the top layer 16 that are separate from an otherwise present electrically conductive power/ground plane. Beneath the first electronic component 22, a first cavity 30 is formed in the electronic circuit board 10 extending through the top layer 16 and the non-electrically conductive dielectric layer 20. The first cavity 30 is sized so as to allow the second electronic component 26 to be mounted therein, thereby allowing the flat gull wing leads 28 of the second electronic component 26 to be electrically connected to a second portion 44 of the electrically conductive contact pads formed on the top layer 16. That is, the second electronic component 26 is mounted such that the flat gull wing leads 28 of the second electronic component 26 are electrically connected to a second portion 44 of the electrically conductive contact pads formed on the top layer 16.

The electrical connections between the curved gull wing leads 24 of the first electronic component 22 and the first portion 42 of the electrically conductive contact pads formed on the top layer 16 are typically made by straight solder connections. Similarly, the electrical connections between the flat gull wing leads 28 of the second electronic component 26 and the second portion 44 of the electrically conductive contact pads formed on the top layer 16 are typically made by straight solder connections.

The second group of stacked electronic components 14 comprises a third electronic component 32 having a curved gull wing leaded package (see curved gull wing lead 34) and a fourth electronic component 36 having a leadless contact package. The curved gull wing leads 34 of the third electronic component 32 are electrically connected to a third portion 46 of the electrically conductive contact pads formed on the top layer 16 that are separate from an otherwise present electrically conductive power/ground plane. Beneath the third electronic component 32, a second cavity 40 is formed in the electronic circuit board 10 extending through the top layer 16 and the non-electrically conductive dielectric layer 20. The second cavity 40 is sized so as to allow the fourth electronic component 36 to be mounted therein, thereby allowing the leadless contacts of the fourth electronic component 36 to be electrically connected to a fourth portion 48 of the electrically conductive contact pads formed on the top layer 16. That is, the fourth electronic component 36 is mounted in the second cavity 40 such that the leadless contacts of the fourth electronic component 36 are electrically connected to a fourth portion 48 of the electrically conductive contact pads formed on the top layer 16.

Similar to the first electronic component 22, the electrical connections between the curved gull wing leads 34 of the third electronic component 32 and the third portion 46 of the electrically conductive contact pads formed on the top layer 16 are typically made by straight solder connections. However, the electrical connections between the leadless contacts of the fourth electronic component 36 and the fourth portion 48 of the electrically conductive contact pads formed on the top layer 16 are typically made by solder bridge connections 38.

At this point it should be noted that, as can be seen from FIG. 1a, the sizing relationship between the cavity 40 and the fourth electronic component 36 is such that the cavity 40 is precisely sized to coincide with the outer dimensions of the fourth electronic component 36. This precise sizing of the cavity 40 allows the fourth electronic component 36 to be positioned within the cavity 40 without the need for any specialized positioning equipment, which has heretofore typically been required when mounting electronic components on circuit boards.

Referring to FIG. 1b, there is shown a top view of the single-sided electronic circuit board 10 shown in FIG. 1a with the first and second groups of stacked electronic components 12 and 14 removed. As can be seen in FIG. 1b, the first portion 42 of the electrically conductive contact pads formed on the top layer 16 of the electronic circuit board 10 are arranged for electrical connection with the curved gull wing leads 24 on all four sides of the first electronic component 22. Similarly, the second portion 44 of the electrically conductive contact pads formed on the top layer 16 of the electronic circuit board 10 are arranged for electrical connection with the flat gull wing leads 28 on all four sides of the second electronic component 26. Similarly still, the third portion 46 of the electrically conductive contact pads formed on the top layer 16 of the electronic circuit board 10 are arranged for electrical connection with the curved gull wing leads 34 on all four sides of the third electronic component 32. However, the fourth portion 48 of the electrically conductive contact pads formed on the top layer 16 of the electronic circuit board 10 are arranged for electrical connection with the leadless contacts on only two sides of the fourth electronic component 32 since the fourth electronic component 32 is a discrete electronic component having only two leadless contacts.

At this point it should be noted that, although only the fourth electronic component 32 is shown as a discrete electronic component having only two leadless contacts, it is also within the scope of the present invention to mount a leaded discrete electronic component in a cavity formed in an electronic circuit board so as to increase electronic component density on the electronic circuit board in accordance with the present invention. Also, although the second electronic component 26 is shown as an integrated circuit electronic component having flat gull wing leads 28 on all four sides of the second electronic component 26, it is also within the scope of the present invention to mount a leadless integrated circuit electronic component in a cavity formed in an electronic circuit board so as to increase electronic component density on the electronic circuit board in accordance with the present invention.

Referring to FIG. 2, there is shown a side cross-sectional view of a double-sided multilayer circuit board 100 having groups of stacked electronic components 102, 104, 106, 108, and 110 in accordance with the present invention. The double-sided multilayer circuit board 100 also has a group of electronic components 112 that are stacked in accordance with the teachings of related U.S. patent application Ser. No. 09/636,594, which has previously been incorporated by reference herein in its entirety, for comparison purposes and for assisting in understanding the concepts and benefits of the present invention. The double-sided multilayer circuit board 100 further has a non-stacked electronic component 114 for comparison purposes and for assisting in understanding the concepts and benefits of the present invention.

The multilayer circuit board 100 comprises a primary (top) layer 120, a secondary (bottom) layer 122, and a plurality of intermediate layers 124. The top layer 120 and the bottom layer 122 are typically electrically conductive power/ground plane layers, but also have electrically conductive contact pads to which electronic components may be electrically connected, as described in detail below. The intermediate layers 124 alternate between non-electrically conductive dielectric layers and either electrically conductive signal layers or electrically conductive power/ground plane layers. For example, in FIG. 2, layers 126, 128, 130, and 132 are non-electrically conductive dielectric layers, and layers 136, 138, and 140 are electrically conductive signal layers. Of course, one of the electrically conductive signal layers 136, 138, or 140 could alternatively be an electrically conductive power/ground plane layer, or a shared power/ground plane and signal layer.

Similar to the first group of stacked electronic components 12 of FIG. 1a, the group of stacked electronic components 102 comprises an electronic component 142 having a curved gull wing leaded package and an electronic component 144 having a flat gull wing leaded package, wherein the electronic component 144 is mounted in a cavity formed in the multilayer circuit board 100 beneath the electronic component 142. Similar to the second group of stacked electronic components 12 of FIG. 1a, the group of stacked electronic components 104 comprises an electronic component 146 having a curved gull wing leaded package and an electronic component 148 having a leadless contact package, wherein the electronic component 148 is mounted in a cavity formed in the multilayer circuit board 100 beneath the electronic component 146. Also similar to the second group of stacked electronic components 12 of FIG. 1a, the group of stacked electronic components 110 comprises an electronic component 150 having a curved gull wing leaded package and an electronic component 152 having a leadless contact package, wherein the electronic component 152 is mounted in a cavity formed in the multilayer circuit board 100 beneath the electronic component 150. Of course, the group of stacked electronic components 110 differs from the group of stacked electronic components 104 and the second group of stacked electronic components 12 of FIG. 1a by being situated on the bottom layer 122 of the multilayer circuit board 100.

The group of stacked electronic components 112, which is stacked in accordance with the teachings of related U.S. patent application Ser. No. 09/636,594, comprises an electronic component 154 having a peripheral ball grid array package, an electronic component 156 having a curved gull wing leaded package, an electronic component 158 having a full ball grid array package, and first and second electrically conductive shielding plates 160 and 162, respectively, which will be described in detail below. The ball grid array contacts of the electronic component 154 are electrically connected to electrically conductive contact pads formed on the bottom layer 122 of the multilayer circuit board 100 that are separate from an otherwise present electrically conductive power/ground plane.

Beneath the electronic component 154, a cavity 164 is formed in the multilayer circuit board 100 extending through the bottom layer 122 and the non-electrically conductive dielectric layer 132 so as to expose at least a portion of the electrically conductive signal layer 140. The portion of the electrically conductive signal layer 140 that is exposed by the cavity 164 has electrically conductive contact pads formed thereon. The curved gull wing leads the electronic component 156 are electrically connected to the electrically conductive contact pads formed on the electrically conductive signal layer 140. That is, the cavity 164 is sized so as to allow the electronic component 156 to be mounted therein and thereby allow the curved gull wing leads of the electronic component 156 to be electrically connected to the electrically conductive contact pads formed on the electrically conductive signal layer 140.

Beneath the electronic component 156, a cavity 166 is formed in the multilayer circuit board 100 extending through the electrically conductive signal layer 140 and the non-electrically conductive dielectric layer 130 so as to expose at least a portion of the electrically conductive signal layer 138. The portion of the electrically conductive signal layer 138 that is exposed by the cavity 166 has electrically conductive contact pads formed thereon. The ball grid array contacts of the electronic component 158 are electrically connected to the electrically conductive contact pads formed on the electrically conductive signal layer 138. That is, the cavity 166 is sized so as to allow the electronic component 158 to be mounted therein and thereby allow the ball grid array contacts of the electronic component 158 to be electrically connected to the electrically conductive contact pads formed on the electrically conductive signal layer 138.

The electrically conductive shielding plate 162 is electrically connected to electrically conductive power/ground contact pads formed on the electrically conducting signal layer 140 so as to provide a shield for any electromagnetic interference (EMI) which may be emanating from the electronic component 158 or against any EMI to which the electronic component 158 may be susceptible. Similarly, the electrically conductive shielding plate 160 is electrically connected to electrically conductive power/ground plane of the bottom layer 122 so as to provide a shield for any electromagnetic interference (EMI) which may be emanating from the electronic component 156 or against any EMI to which the electronic component 156 may be susceptible.

The above-described mounting and shielding concepts are employed in the groups of stacked electronic components 106 and 108. That is, the group of stacked electronic components 106 comprises an electronic component 168 having a curved gull wing leaded package, an electronic component 170 having a curved gull wing leaded package, an electronic component 172 having a flat gull wing leaded package, and an electrically conductive shielding plate 174, wherein the electronic component 170 is mounted in a cavity 176 formed in the multilayer circuit board 100 beneath the electronic component 168, the electronic component 172 is mounted in a cavity 178 formed in the multilayer circuit board 100 beneath the electronic component 170, and the electrically conductive shielding plate 174 shields any electromagnetic interference (EMI) which may be emanating from the electronic components 170 or 172 or against any EMI to which the electronic components 170 or 172 may be susceptible.

The group of stacked electronic components 108 comprises an electronic component 180 having a peripheral ball grid array package, an electronic component 182 having a curved gull wing leaded package, an electronic component 184 having a curved gull wing leaded package, an electronic component 186 having a leadless contact package, and an electrically conductive shielding plate 188, wherein the electronic component 182 is mounted in a cavity 190 formed in the multilayer circuit board 100 beneath the electronic component 180, the electronic component 184 is mounted in a cavity 192 formed in the multilayer circuit board 100 beneath the electronic component 182, the electronic component 186 is mounted in a cavity 194 formed in the multilayer circuit board 100 beneath the electronic component 184, and the electrically conductive shielding plate 188 shields any electromagnetic interference (EMI) which may be emanating from the electronic components 182, 184, or 186 or against any EMI to which the electronic components 182, 184, or 186 may be susceptible.

The non-stacked electronic component 114 has a full ball grid array package, wherein the ball grid array contacts of the electronic component 114 are electrically connected to electrically conductive contact pads formed on the bottom layer 122 of the multilayer circuit board 100 that are separate from an otherwise present electrically conductive power/ground plane.

At this point it should be noted that, as can be seen from FIG. 2, cavities can be formed in both sides of the double-sided electronic circuit board 100 with no detrimental effects to the structure of the double-sided multilayer circuit board 100. That is, as long as one or more layers are still present between an upper cavity (e.g., cavity 178) and a lower cavity (e.g., cavity 166), there should be no detrimental effects to the structure of the double-sided multilayer circuit board 100. In fact, regardless of whether there is an opposing cavity formed in the double-sided multilayer circuit board 100 (e.g., a cavity opposing the decreasing-sized cavities 190, 192, and 194), there should be no detrimental effects to the structure of the double-sided multilayer circuit board 100. However, even if structural integrity is a concern, most, if not all, circuit boards in use today use board edge stiffeners to provide additional structural support and prevent against warpage.

It should also be noted that a cavity formed in a circuit board in accordance with the present invention as described above may have many different forms and functions. For example, a cavity may be precisely sized to coincide with the outer dimensions of an electronic component to be mounted therein so as to assist in precisely mounting the electronic component in the cavity, as discussed above. Alternatively, a cavity may be sized somewhat larger than the size of an electronic component to be mounted therein so as to allow ambient air to assist in cooling the electronic component, as shown above. Alternatively still, a cavity may be formed as a channel through which air may be forced to assist in cooling an electronic component mounted therein.

It should further be noted that although the above-described embodiments have been described with the electronic components having gull wing leaded packages, ball grid array packages, or leadless contact packages, the present invention is not limited in this regard. For example, electronic components having dual-in-line packages (DIP), pin grid array (PGA) packages, and leadless chip carrier packages, to name a few, can also be stacked in accordance with the practices of the present invention.

It should still further be noted that the above-described cavities and/or channels can be formed using several different types of fabrication methods. For example, photolithographic or plasma-based etching can be used to form cavities and/or channels in a resin or epoxy-based electronic circuit board in accordance with the present invention. Alternatively, if an electronic circuit board is glass reinforced (and thereby not easily etchable by conventional etching techniques), precision milling by laser ablation using a $CO_2$ laser, or other milling techniques or non-conventional etching techniques, can be used to form cavities and/or channels in an electronic circuit board in accordance with the present invention. Alternatively still, the dielectric layers and/or the electrically conductive layers may be prefabricated such that the cavities/channels are formed upon assembly of the dielectric layers and the electrically conductive layers into the electronic circuit board in accordance with the present invention.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. An improved electronic circuit board for enabling the stacking of electronic components, the electronic circuit board having first and second electrically conductive signal layers formed on first and second dielectric layers, the first and second electrically conductive signal layers having first and second respective pluralities of electrically conductive pads formed therein, the improvement comprising:

a first cavity in a first side of the electronic circuit board extending through the first electrically conductive signal layer and the first dielectric layer, wherein the first cavity is sized to accommodate a first electronic component therein such that at least one first electrical connection may be formed between the first electronic component and a first portion of the first plurality of electrically conductive pads, and at least one second electrical connection may be formed between a second electronic component, which is stacked over the first electronic component, and a second portion of the first plurality of electrically conductive pads; and a second cavity in a second side of the electronic circuit board extending through the second electrically conductive signal layer and the second dielectric layer, wherein the second cavity is sized to accommodate a third electronic component therein such that at least one third electrical connection may be formed between the third electronic component and a first portion of the second plurality of electrically conductive pads, and at least one fourth electrical connection may be formed between a fourth electronic component, which is stacked over the third electronic component, and a second portion of the second plurality of electrically conductive pads.

2. The improved electronic circuit board as defined in claim 1, wherein each of the first and second electronic components is one of an integrated circuit component and a discrete component.

3. The improved electronic circuit board as defined in claim 1, wherein the at least one first electrical connection is formed by a solder bridge.

4. The improved electronic circuit board as defined in claim 1, wherein each of the at least one first electrical connection and the at least one second electrical connection is formed by a solder connection between a component lead and a respective electrically conductive pad.

5. The improved electronic circuit board as defined in claim 1, wherein at least the lateral dimensions of the first cavity are sized to directly coincide with at least the lateral dimensions of the first electronic component.

6. The improved electronic circuit board as defined in claim 1, wherein the first cavity is a channel through which air may be forced for cooling at least the first electronic component.

7. The improved electronic circuit board as defined in claim 1, wherein the electronic circuit board has a third electrically conductive layer disposed above the first electrically conductive signal layer within the electronic circuit board, and wherein the third electrically conductive layer is separated from the first electrically conductive signal layer by at least one third dielectric layer, further comprising:
   a third cavity in the first side of the electronic circuit board extending through the third electrically conductive layer and the at least one third dielectric layer so as to expose at least the first and second portions of the first plurality of electrically conductive pads within the third cavity, wherein the third cavity is sized to accommodate the second electronic component therein.

8. The improved electronic circuit board as defined in claim 7, wherein the third cavity is sized so as to be larger in lateral dimension than the first cavity.

9. The improved electronic circuit board as defined in claim 7, wherein the third electrically conductive layer is one of an electrically conductive signal layer and an electrically conductive power/ground plane layer.

10. The improved electronic circuit board as defined in claim 7, further comprising:
    a fifth electronic component, which is stacked over the second electronic component, making electrical contact with the third electrically conductive layer.

11. The improved electronic circuit board as defined in claim 10, wherein the fifth electronic component is an electrically conductive shield for shielding electromagnetic interference to and from the first and second electronic components.

12. The improved electronic circuit board as defined in claim 10, wherein the fifth electronic component is one of an integrated circuit component and a discrete component.

13. The improved electronic circuit board as defined in claim 1, wherein the first dielectric layer is disposed beneath the first electrically conductive signal layer relative to the first side of the electronic circuit board, and wherein the second dielectric layer is disposed beneath the second lectrically conductive signal layer relative to the second side of the electronic circuit board.

14. The improved electronic circuit board as defined in claim 13, wherein the second cavity is located substantially opposite the first cavity in the electronic circuit board.

* * * * *